(12) United States Patent
Gaide et al.

(10) Patent No.: US 10,043,724 B1
(45) Date of Patent: Aug. 7, 2018

(54) USING AN INTEGRATED CIRCUIT DIE FOR MULTIPLE DEVICES

(71) Applicant: Xilinx, Inc., San Jose, CA (US)

(72) Inventors: Brian C. Gaide, Erie, CO (US); Nui Chong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/346,179

(22) Filed: Nov. 8, 2016

(51) Int. Cl.
| H01L 23/10 | (2006.01) |
| H01L 27/118 | (2006.01) |
| H01L 21/78 | (2006.01) |
| H01L 23/538 | (2006.01) |

(52) U.S. Cl.
CPC ............. *H01L 23/10* (2013.01); *H01L 21/78* (2013.01); *H01L 23/5386* (2013.01); *H01L 27/11898* (2013.01)

(58) Field of Classification Search
CPC ..... H01L 23/10; H01L 21/78; H01L 23/5386; H01L 27/11898
See application file for complete search history.

(56) References Cited

U.S. PATENT DOCUMENTS

| 6,509,617 B2 * | 1/2003 | Hiraga ................. H01L 23/585 257/355 |
| 7,992,020 B1 | 8/2011 | Tuan et al. |
| 8,418,115 B1 | 4/2013 | Tom et al. |
| 8,539,420 B2 | 9/2013 | Camarota |
| 8,886,481 B1 | 11/2014 | Rahman et al. |
| 8,952,517 B2 * | 2/2015 | Kwon ................... H01L 25/105 257/686 |
| 9,142,581 B2 * | 9/2015 | Qian ................. H01L 21/76898 |
| 2013/0307144 A1 * | 11/2013 | Yu .......................... H01L 24/81 257/737 |

* cited by examiner

*Primary Examiner* — Sonya D McCall Shepard
(74) *Attorney, Agent, or Firm* — Robert M. Brush

(57) ABSTRACT

In an example, a semiconductor assembly includes an integrated circuit (IC) die. The IC die includes a first region that includes a programmable fabric; a second region that includes input/output (IO) circuits; and a third region that includes a die seal disposed between the programmable fabric and the IO circuits.

9 Claims, 8 Drawing Sheets

USING AN INTEGRATED CIRCUIT DIE FOR MULTIPLE DEVICES

TECHNICAL FIELD

Examples of the present disclosure generally relate to semiconductor devices and, in particular, to using an integrated circuit die for multiple devices.

BACKGROUND

Electronic devices, such as tablets, computers, copiers, digital cameras, smart phones, control systems, among others, often employ electronic components that leverage chip package assemblies for increased functionality and higher component density. Conventional chip packaging schemes often utilize a package substrate, sometimes in conjunction with an interposer, to enable a plurality of integrated circuit (IC) dies to be mounted within a single package. The IC dies may include memory, logic, or other devices.

In some devices, smaller homogenous IC dies are combined within a package to form a larger device. In such case, it is desirable to use the same IC die design for each individual IC the in the package. IC dies having perimeter input/output (IO) circuitry pose challenges for reusing the same IC die to form a larger device in a package. For example, it is problematic to use an IC die having perimeter IO as an "interior" die, i.e., an IC die not on an edge of the package. For interior die, the perimeter IOs are unusable. Further, die-to-die signals have to reach significantly farther, package cavities must grow, interposer costs increase, and static power consumption increases.

SUMMARY

Techniques for using an integrated circuit (IC) die for multiple devices are described. In an example, a semiconductor assembly includes an integrated circuit (IC) die. The IC die includes a first region that includes a programmable fabric; a second region that includes input/output (IO) circuits; and a third region that includes a die seal disposed between the programmable fabric and the IO circuits.

In another example, a method of fabricating a semiconductor assembly includes forming a plurality of integrated circuit (IC) dies each having a fabric region and an input/output (IO) region separated from the fabric region by a die seal region; forming serpentine channels in each die seal region and metal connections in each serpentine channel to electrically connect the fabric region and the IO region of each of the plurality of IC dies; sawing off the IO region of at least one IC die of the plurality of IC dies; and mounting the plurality of IC dies on a package substrate or an interposer.

In another example, a method of fabricating a semiconductor assembly includes: forming a plurality of integrated circuit (IC) dies each having a fabric region and an input/output (IO) region separated from the fabric region by a die seal region; patterning at least one metal layer in the die seal region at least one first IC die of the plurality of IC dies to electrically connect the fabric region and the IO region; forming complete die seals in the die seal region of at least one second IC die of the plurality of IC dies; sawing off the IO region of each of the at least one second IC die; and mounting the plurality of IC dies on a package substrate or an interposer.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
FIG. 1 is a block diagram depicting an integrated circuit (IC) die according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 10:
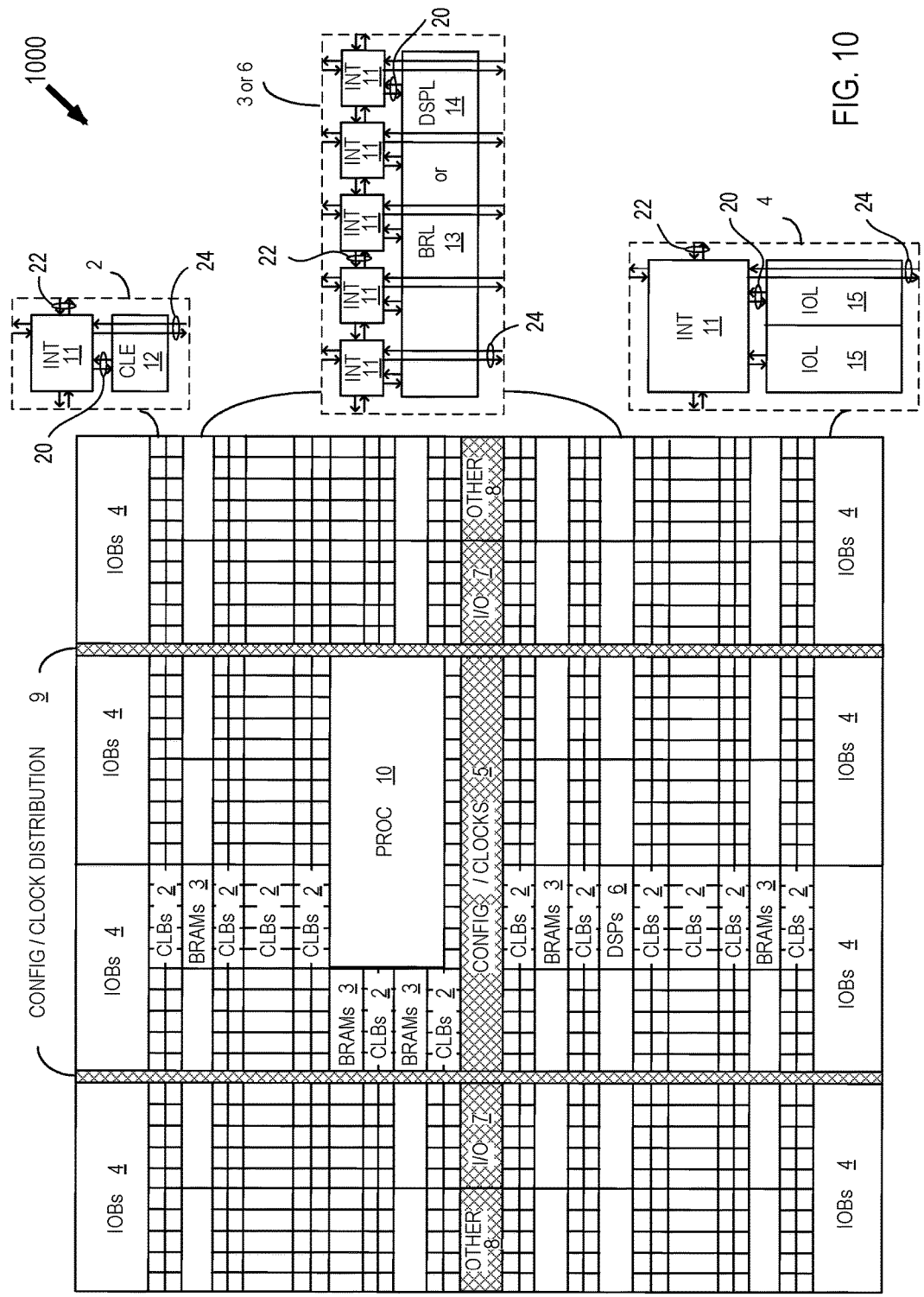
FIG. 10 illustrates an architecture of a field programmable gate array (FPGA) according to an example.

FIG. 1 is a block diagram depicting an integrated circuit (IC) die 100 according to an example. The IC die 100 includes a fabric 102 and input output (10) circuits 108. The fabric 102 comprises the core logic of the IC die 100. The IO circuits 108 provide an external input interface to the fabric 102 and an external interface from the fabric 102. The IO circuits 108 are disposed along the perimeter of the IC die 100. In the example shown, the IO circuits 108 are disposed along the top of the IC die 100. In general, the IO circuits 108 can be disposed along one or more edges of the IC die 100 (e.g., one or more of the top, bottom, left, and right edges). In an example, the fabric 102 comprises a programmable fabric of a programmable IC, such as a field programmable gate array (FPGA). An example FPGA architecture is shown in FIG. 10 and described further below.

In the example shown, the IC die 100 is surrounded by a die seal 104 (also referred to as a seal ring or guard ring). The die seal 104 mitigates die-sawing stress and prevents contaminates from entering into the circuits of the IC die 100 (e.g., the fabric 102 and the IO circuits 108). In general, the die seal 104 can include metal layers and vias surrounding the fabric 102 and the IO circuits 108. The metal layers and vias can be continuous and uninterrupted by gaps in order to block contaminates from moving into the active area of the IC die 100. In some examples, a diffusion is disposed in the semiconductor substrate underneath the die seal 104 as an extra substrate contact for electrically connecting the die seal 104 to the substrate (e.g., to electrically ground the die seal 104 during operation). Multiple instances of the IC die 100 can be fabricated at the same time on a wafer. Instances of the IC die 100 can be singulated from the wafer by sawing along scribe areas between the IC dies.

In an example, the IC die 100 is configured such that it can be used in multiple positions in a multi-die package, including an interior position and an edge position. When used in an interior position, the IO circuits 108 are removed from the IC die 100 (e.g., sawed off the IC die 100). Accordingly, the IC die 100 includes an additional die seal (shown as "die seal 106") disposed between the fabric 102 and the IO circuits 108. The dashed lined demarcate the boundaries between the additional die seal 106 and the die seal 104 for purposes of this description. Physically, the additional die seal 106 and the die seal 104 can be continuous. When the IO circuits 108 are sawed off of the IC die 100, the fabric 102 remains protected by a die seal on all sides.

Figure 3:
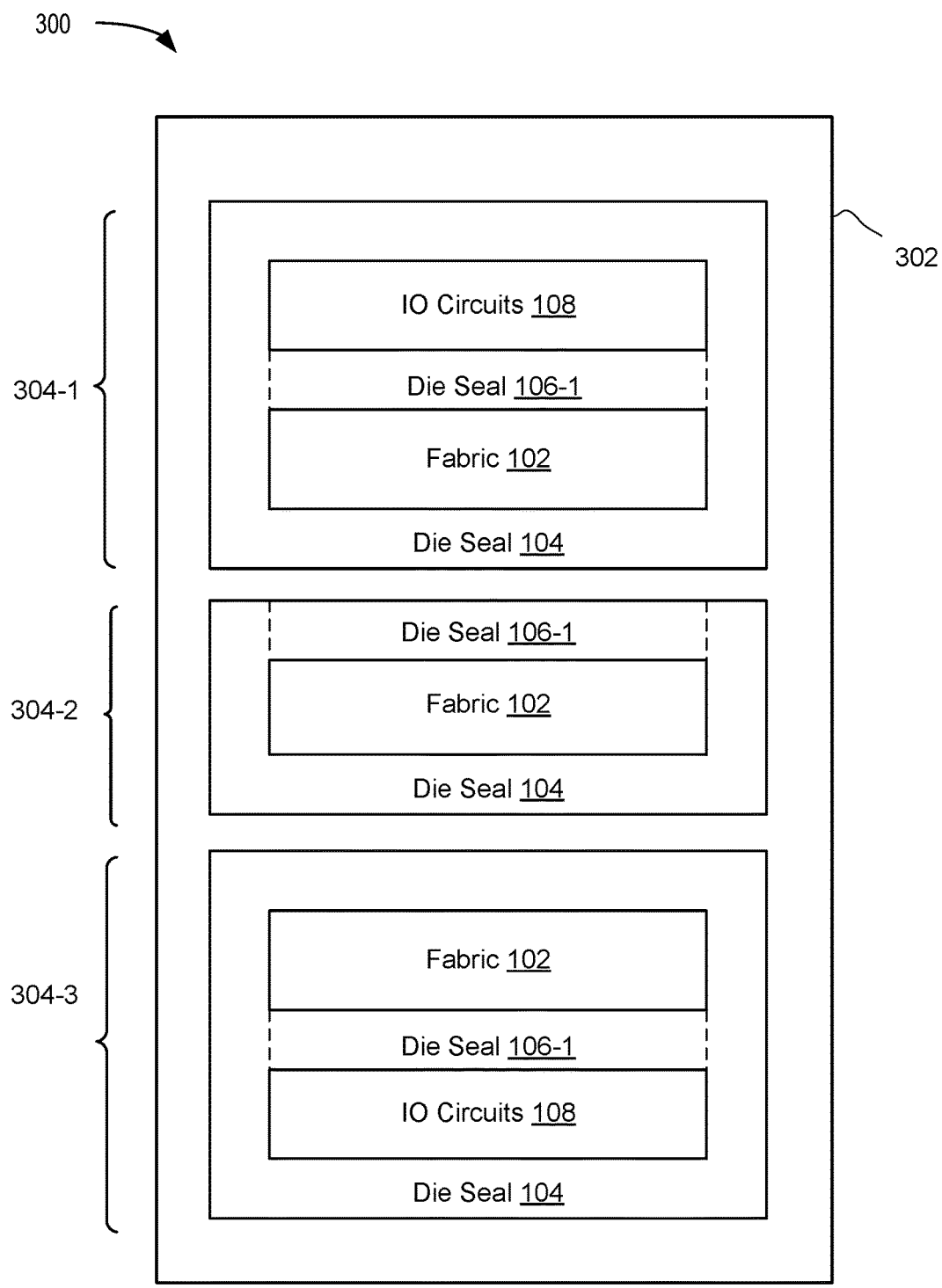
FIG. 3 is a block diagram depicting a semiconductor assembly according to an example.

FIG. 3 is a block diagram depicting a semiconductor assembly 300 according to an example. The semiconductor assembly comprises a substrate 302, such as a package substrate or interposer. In the example, three IC dies 304-1, 304-2, and 304-3 are electrically and mechanically connected to the substrate 302. The IC dies 304 can be obtained by manufacturing three instances of the IC die 100 shown in FIG. 1. The top IC die 304-1 and the bottom IC die 304-3 each comprise an instance of the IC die 100 in its entirety including the fabric 102, the IO circuits 108, the die seal 104, and the die seal 106. The IC die 304-3 can be an instance of the IC die 100 rotated 180 degrees with respect to that of the IC die 304-1. Thus, the semiconductor assembly 300 includes IO circuits 108 at the perimeter thereof (e.g., at the top and bottom edges). The IC die 304-2 is an interior IC die disposed between the IC die 304-1 and the IC die 304-2. To conserve area and power, the IC die 304-2 does not include IO circuits. The IC die 304-2 can be produced by sawing off the IO circuits 108 from the IC die 100. The IC dies 304-1, 304-2, and 304-3 can be electrically connected through the substrate 302 to form a larger device. The larger device effectively has the same structure as the smaller IC die 100, i.e., fabric 102 having perimeter IO circuits 108.

Although three IC dies 304 are shown in the example, the semiconductor assembly 300 can include any number of IC dies 304. In general, the semiconductor assembly 300 can include a single column of N IC dies, where N is an integer greater than or equal to zero. The top-most and bottom-most ones of the N IC dies are instances of the IC die 100. Any interior IC dies between the top-most and bottom-most IC dies are instances of the IC die 100 with the IO circuits 108 removed. The die seal 106 remains to protect the fabric 102 of the interior IC die(s). In this manner, a semiconductor assembly of any size can be formed using only one IC die design (e.g., the IC die 100). It is not necessary to fabricate special interior versions of the IC die separately from the top and bottom versions of the IC die.

Figure 11:
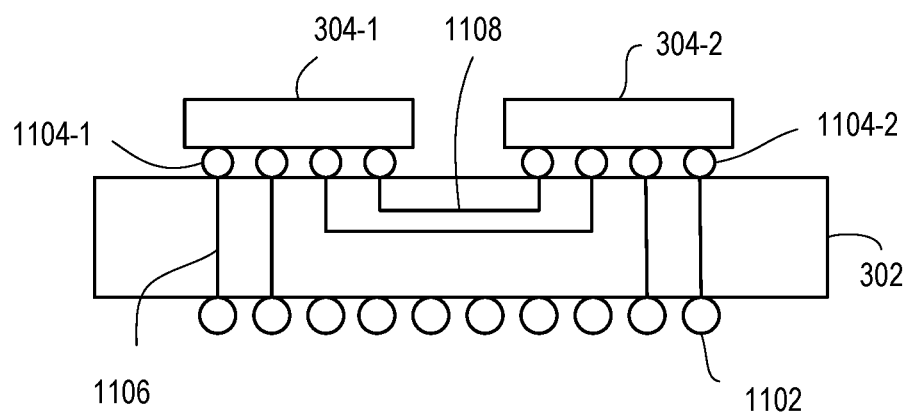
FIG. 11 is a cross-section depicting a portion of the semiconductor assembly of FIG. 3.

FIG. 11 is a cross-section showing a portion of the semiconductor assembly 300 according to an example. The portion shown in FIG. 11 includes the substrate 302 and the IC dies 304-1 and 304-2. The IC die 304-1 includes electrical contacts 1104-1 and the IC die 304-2 includes electrical contacts 1104-2. The electrical contacts 1104-1 and 1104-2 can be solder bumps or the like and are configured to mechanically and electrically couple the IC dies 304-1 and 304-2 to the substrate 302. The substrate 302 includes electrical contacts 1102 (e.g., solder balls) that are configured to mechanically and electrically coupled the substrate 302 to external circuitry (e.g., a printed circuit board or the like). Some of the electrical contacts 1104-1 and 1104-2 are coupled to electrical contacts 1102 using through-substrate vias (TSVs). In this manner, the fabric 102 and I/O circuits 108 of the IC die 304-1, and the fabric 102 of the IC die 304-2, can be coupled to the electrical contacts 1102 and accessed by external circuitry. Others of the electrical contacts 1104-1 are electrically coupled to others of the electrical contacts 1104-2 through wiring formed in the substrate 302. In this manner, the fabric 102 of the IC die 304-2 can be electrically coupled to the fabric 102 of the IC die 304-1. Any number of the IC dies 304 can be configured as shown in FIG. 11. In an example, the fabric 102 in each of the IC dies 304-1 and 304-2 can include circuitry (e.g., drivers, receivers, multiplexers, and the like) that is configured to electrically couple the fabric 102 to the electrical contacts 1104-1 and 1104-2, respectively.

Figure 2:
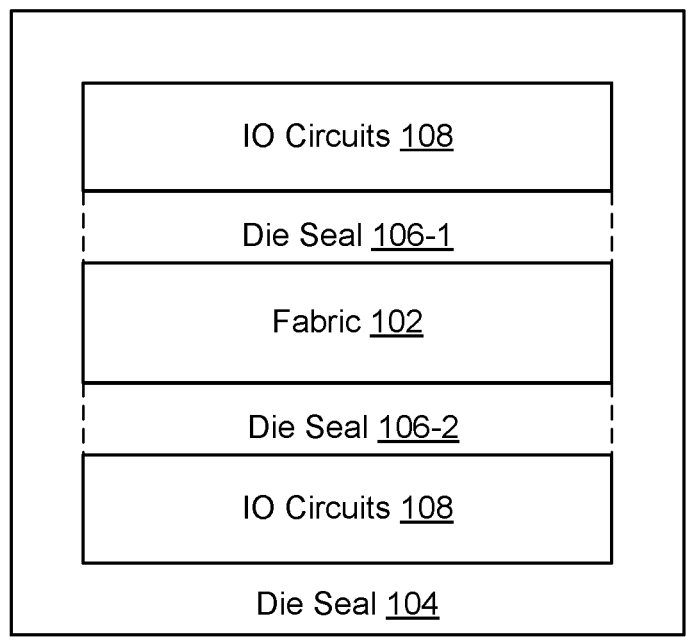
FIG. 2 is a block diagram depicting another example of an IC die.

In the example of FIG. 1, the IO circuits 108 are disposed along the top edge of the IC die 100. FIG. 2 is a block diagram depicting another example of an IC die 100A. The IC die 100A includes IO circuits 108 disposed at both the top and bottom edges. Similar to the IC die 100, the IO circuits 108 and the fabric 102 are surrounded by the die seal 104. Further, a die seal 106-1 is disposed between the fabric 102 and the IO circuits 108 at the top edge, and a die seal 106-2 is disposed between the fabric 102 and the IO circuits 108 at the bottom edge. The IC die 100A can be used to manufacture a semiconductor assembly 300 similar to that shown in FIG. 3. A top-most IC die can be obtained by sawing off the IO circuits 108 along the bottom edge of the IC die 100A. A bottom-most IC die can be obtained by sawing off the IO circuits 108 along the top edge of the IC die 100A. An interior IC die can be obtained by sawing off the IO circuits 108 at both edges of the IC die 100A. In each case, the combination of the die seal 104 and the die seal 106-1 and/or 106-2 seal the active area of each IC die of the semiconductor assembly.

In the examples above, the IC dies 100 and 100A include IO circuits 108 at the top and/or bottom edges thereof. In other examples, an IC die can include IO circuits at the right and/or left edges thereof. A die seal is disposed between the fabric and the IO circuits. Such an IC die can be used to manufacture a semiconductor assembly having a single row of N IC dies, where N is greater than or equal to zero. Any IC dies between the right-most IC die and the left-most IC die can have the IO circuits thereof removed, as described above. In still other examples, an IC die can include IO circuits at three or all four edges thereof. A die seal is disposed between each instance of the IO circuits and the fabric. Such an IC die can be used to form a one dimensional array, such as that shown in FIG. 3. In addition, such an IC die can be used to form a two-dimensional array.

Figure 4:
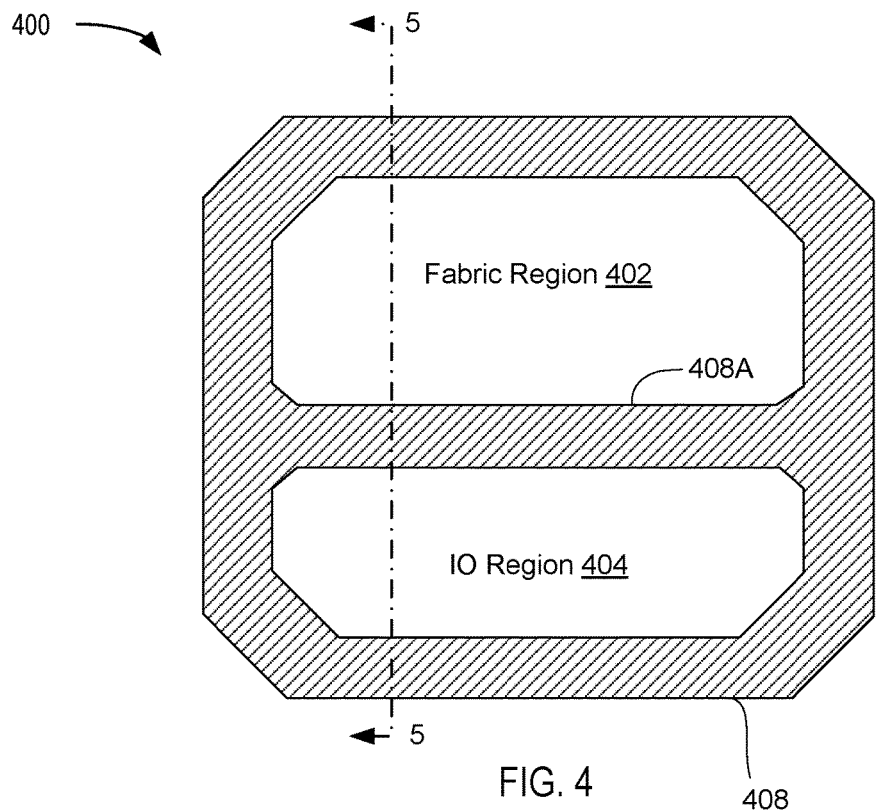
FIGS. 4 and 5 show a top-view and a cross-sectional view, respectively, of an IC die according to an example.
Figure 5:
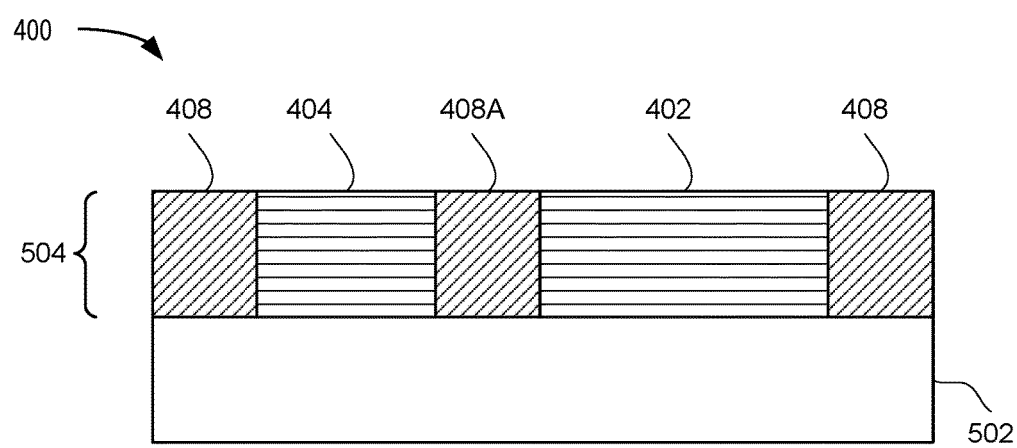

FIGS. 4 and 5 show a top-view and a cross-sectional view of an IC die 400 according to an example. The cross-sectional view shown in FIG. 5 is taken along the line 5-5 shown in FIG. 4. As shown in FIGS. 4-5, the IC die 400 includes a fabric region 402 and an IO region 404. In the example, only a single IO region 404 is shown along the bottom edge of the IC die 400. As described above, in other examples, an IC die can include IO circuits along one or more edges thereof. The IC die 400 includes a die seal region 408 surrounding the fabric region 402 and the IO region 404. Further, the IC die 400 includes a die seal region 408A disposed between the fabric region 402 and the IO region 404. The die seal region 408A abuts the die seal region 408 at each edge thereof.

As shown in the cross-section of FIG. 5, the IC die 400 includes a semiconductor substrate 502 and a plurality of metal and dielectric layers 504 disposed thereon. In the regions 408, the metal and dielectric layers 504 are patterned to form a die seal. Likewise, in the region 408A, the metal and dielectric layers 504 are patterned to form a die seal. The metal and dielectric layers 504 in the region 408A are further patterned to form electrical connections between circuits in the fabric region 402 and circuits in the IO region 404, as discussed further below. In the regions 402 and 404, the metal and dielectric layers 504 are configured to form electrical connections between circuits (e.g., connections between circuits within the fabric region 402 or connections between circuits within the IO region 404).

Figure 6:
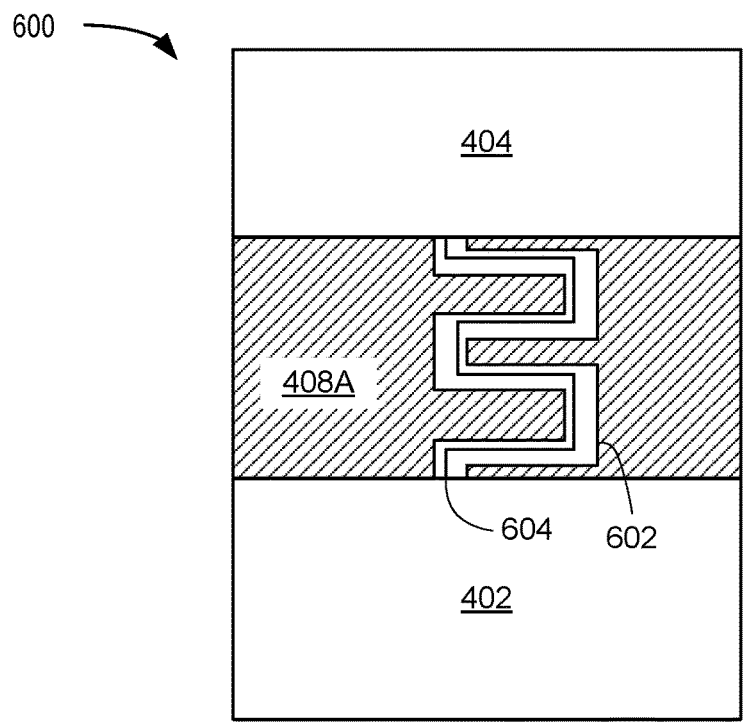
FIG. 6 is a top-view of a portion of the IC die of FIGS. 4 and 5 according to an example.

FIG. 6 is a top-view of a portion 600 of the IC die 400 according to an example. The portion 600 shows an electrical connection between circuits formed in the fabric region 402 and circuits formed in the IO region 404. To connect the fabric to the IO circuits, electrical connections traverse the die seal region 408A. In an example, one or more serpentine channels 602 are formed in the die seal region 408A that extend between the fabric region 402 and the IO region 404. The serpentine channels 602 can be formed in one or more of the metal and dielectric layers 504. One or more metal connections 604 are formed in each serpentine channel 602. For example, the metal connections 604 can be formed on the same or on different metal layers 504 within a given serpentine channel 602. Each serpentine channel 602 includes a plurality of turns. In the example shown, the serpentine channel 602 includes eight turns, but in general a serpentine channel can include more or less than eight turns.

To form a full moisture barrier, a die seal should not include gaps. However, a die seal between the fabric region and the IO region can support electrical connections between circuits in the fabric region and circuits in the IO region. The serpentine channels 602 mitigate the effect on the integrity of the die seal between the fabric region 402 and the IO region 404. The serpentine channels 602 effectively increase the distance that moisture or other contaminates must travel in order to enter into the fabric region 402 after the IO region 404 is sawed off. The die seal is a physical barrier that protects the circuitry from the die-saw process. The serpentine channels 602 mitigate the effect that the routing between the fabric and the IO region has on the physical barrier provided by the die seal.

Figure 7:
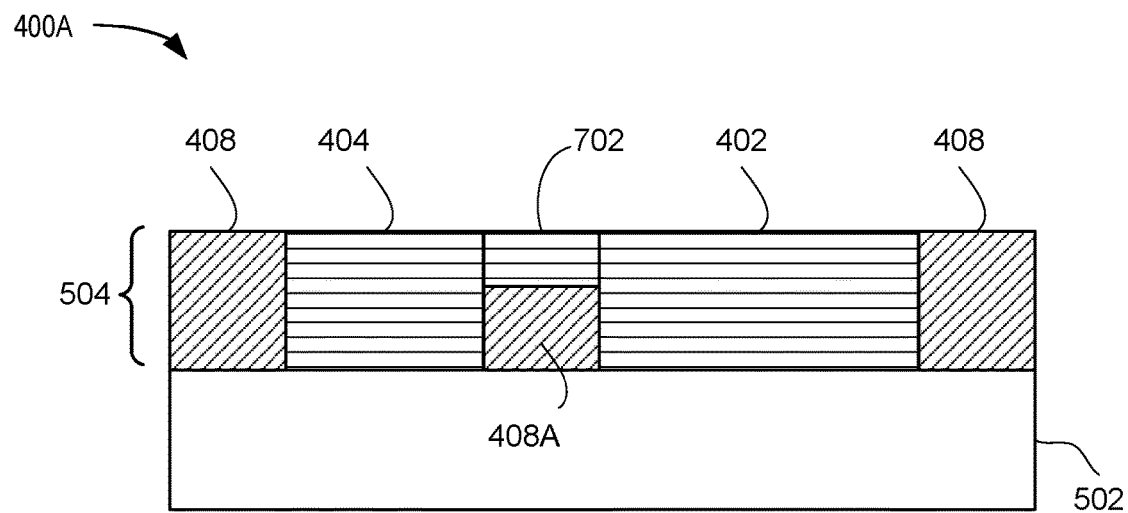
FIG. 7 is a cross-sectional view of another IC die according to an example.

FIG. 7 is a cross-sectional view of an IC die 400A according to an example. In the example shown, there are no serpentine channels 602 formed through the die seal region 408A as shown in FIG. 6. Rather, the die seal region 408A can include a portion 702 where the metal and dielectric layers 504 are patterned to establish electrical connections between the fabric circuitry and the IO circuitry. The metal and dielectric layers 504 are patterned in the portion 702 to insulate the electrical connections from the die seal. For each IC die in the semiconductor assembly where the IO circuitry is not removed, the configuration shown in FIG. 7 can be used. For each IC die in the semiconductor assembly where the IO circuitry is removed (e.g., interior IC die), then the die seal region 408A can include only a die seal without electrical connections between the fabric and IO circuitry. This allows a complete die seal to be in place for those IC die where the IO circuitry will be removed. Depending on the number of layers in the portion 702 used for routing between the fabric and IO circuitry, only a few masks need to be modified to support the two configurations of the IC die (i.e., one configuration with a complete die seal and one configuration with routing between the fabric and IO circuitry).

Figure 8:
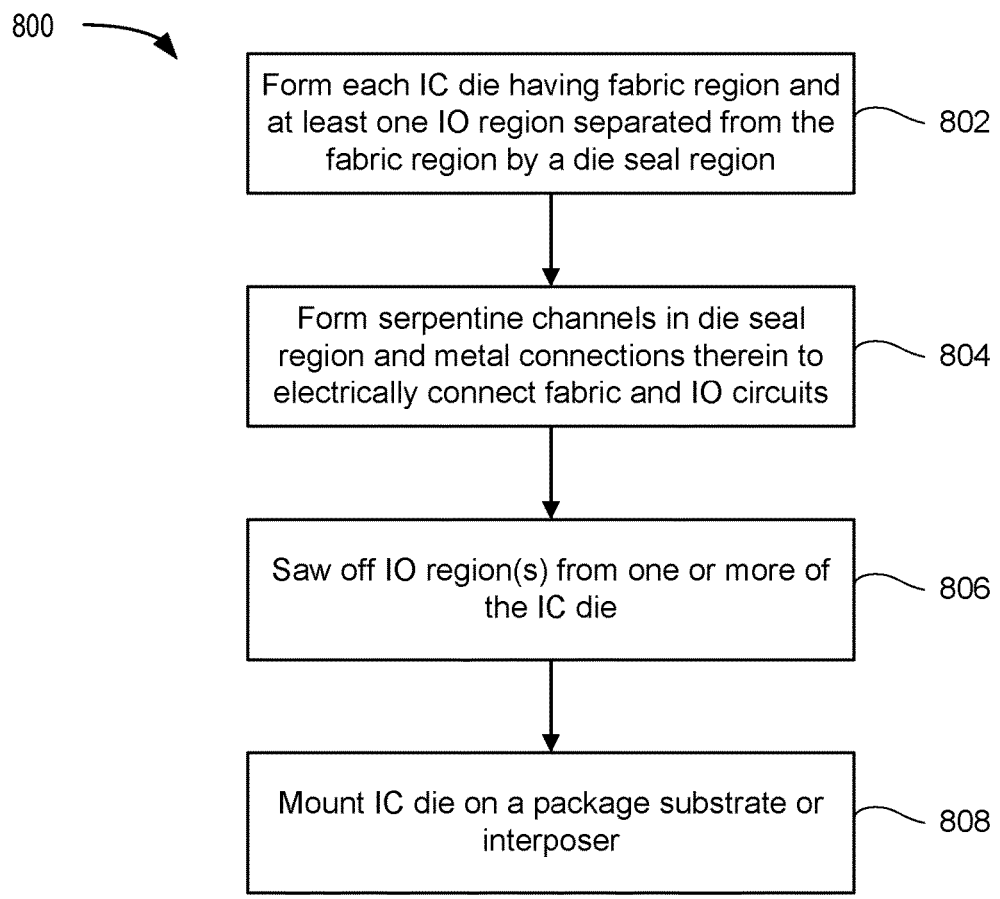
FIG. 8 is a flow diagram depicting a method of fabricating a semiconductor assembly according to an example.

FIG. 8 is a flow diagram depicting a method 800 of fabricating a semiconductor assembly according to an example. The method 800 begins at step 802, where each IC die is formed having a fabric region and at least one IO region separated from the fabric region by a die seal region. The IC dies can be formed on a wafer using conventional semiconductor fabrication techniques. At step 804, serpentine channels are formed in the die seal region between the fabric and IO regions and metal connections are formed therein to electrically connect the fabric and IO circuits. One or more dielectric layers insulate the metal connections from the die seal. At step 806, for one or more of the IC dies, one or more of the IO regions are removed leaving the die seal intact. At step 808, the IC dies are mounted on package substrates or interposers to form the semiconductor assemblies. Those of the IC dies having the IO circuitry removed are used as the interior IC dies in the packages.

Figure 9:
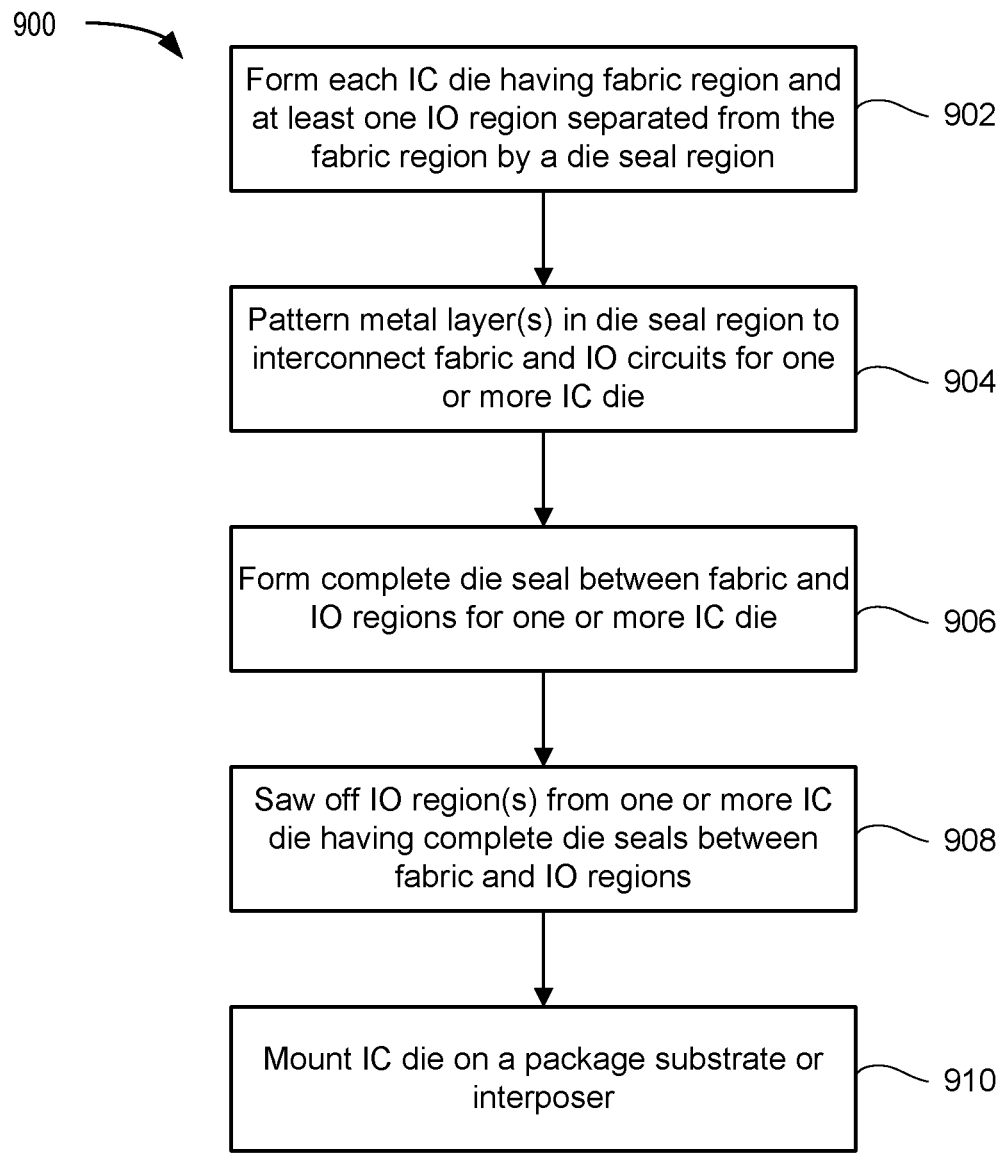
FIG. 9 is a flow diagram depicting a method of fabricating a semiconductor assembly according to another example.

FIG. 9 is a flow diagram depicting a method 900 of fabricating a semiconductor assembly according to another example. The method 900 begins at step 902, where each IC die is formed having a fabric region and at least one IO region separated from the fabric region by a die seal region. The IC dies can be formed on a wafer using conventional semiconductor fabrication techniques. At step 904, for one or more of the IC dies, metal layer(s) are patterned in the die seal region to interconnect the fabric and IO circuits (e.g., as shown in FIG. 7). Dielectric layers insulate the metal layer(s) from the die seal. At step 906, a complete die seal is formed between the fabric and IO regions for one or more others of the IC dies. At step 908, for one or more of the IC die having complete die seals between the fabric and IO regions, one or more of the IO regions are removed. At step 910, the IC dies are mounted on package substrates or interposers to form the semiconductor assemblies. Those of the IC dies having the IO circuitry removed are used as the interior IC dies in the packages. As opposed to the technique of FIG. 8, the exposed die seals from sawing off the IO regions are complete and do not have gaps due to any channels used to support routing between the fabric and IO circuitry.

FIG. 10 illustrates an architecture of an FPGA 1000 that includes a large number of different programmable tiles including configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. The IOBs 4 are disposed around the periphery of the programmable fabric of the CLBs 2, BRAMs 3, etc.

In some FPGAs, each programmable tile can include at least one programmable interconnect element ("INT") 11 having connections to input and output terminals 20 of a programmable logic element within the same tile, as shown by examples included at the top of FIG. 10. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A semiconductor assembly, comprising:
   a first integrated circuit (IC) die, including:
      a first region that includes a first programmable fabric;
      a second region that includes first input/output (IO) circuits; and
      a third region that includes a first die seal disposed between the first programmable fabric and the first IO circuits;
   a substrate supporting the first IC die; and
   a second IC die disposed on the substrate and electrically interconnected to the first IC die through the substrate, the second IC die including:
      a fourth region that includes a second programmable fabric; and
      a fifth region that includes a second die seal disposed between the second programmable fabric and the first IC die.

2. The semiconductor assembly of claim 1, wherein the first IO circuits are adjacent to a first side of the programmable fabric, and wherein the first IC die includes:
   a fifth region that includes second IO circuits adjacent to a second side of the first programmable fabric; and
   a sixth region that includes a third die seal disposed between the first programmable fabric and the second IO circuits.

3. The semiconductor assembly of claim 1, wherein the third region includes a plurality of serpentine channels formed in the first die seal and a plurality of metal lines disposed in the plurality of serpentine channels, the plurality of metal lines electrically connecting the first programmable fabric and the first IO circuits.

4. The semiconductor assembly of claim 1, wherein the first die seal comprises a plurality of metal layers and a plurality of dielectric layers, and wherein a portion of the plurality of metal layers include a plurality of metal lines electrically connecting the first programmable fabric and the first IO circuits.

5. The semiconductor assembly of claim 1, further comprising:
   a third IC die disposed on the substrate and electrically interconnected to at least one of the first IC die and the second IC die.

6. The semiconductor assembly of claim 5, wherein the third IC die includes:
   a sixth region that includes a third programmable fabric;
   a seventh region that includes second IO circuits; and
   a eighth region that includes a third die seal disposed between the third programmable fabric and the second IO circuits.

7. The semiconductor assembly of claim 6, wherein the first IO circuits are adjacent to a first side of the substrate and the second IO circuits are adjacent a second side of the substrate opposite the first side of the substrate.

8. The semiconductor assembly of claim 6, wherein the eighth region includes a plurality of serpentine channels formed in the third die seal and a plurality of metal lines disposed in the plurality of serpentine channels, the plurality of metal lines electrically connecting the third programmable fabric and the second IO circuits.

9. The semiconductor assembly of claim 7, wherein the second IC die does not include IO circuits adjacent the first IC die and the second IC die.

\* \* \* \* \*